(12) United States Patent
Sasaki et al.

(10) Patent No.: US 11,611,036 B2
(45) Date of Patent: *Mar. 21, 2023

(54) SPIN-CURRENT MAGNETIZATION ROTATIONAL ELEMENT AND SPIN ORBIT TORQUE TYPE MAGNETORESISTANCE EFFECT ELEMENT

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 127 days.

This patent is subject to a terminal disclaimer.

(21) Appl. No.: 17/077,165

(22) Filed: Oct. 22, 2020

(65) Prior Publication Data

US 2021/0043831 A1    Feb. 11, 2021

Related U.S. Application Data

(62) Division of application No. 16/467,157, filed as application No. PCT/JP2018/029754 on Aug. 8, 2018, now Pat. No. 10,910,554.

(30) Foreign Application Priority Data

Sep. 7, 2017   (JP) .............................. JP2017-172399

(51) Int. Cl.
    *H01L 27/22*    (2006.01)
    *H01L 43/04*    (2006.01)
    (Continued)

(52) U.S. Cl.
    CPC ............. *H01L 43/04* (2013.01); *H01L 27/222* (2013.01); *H01L 43/06* (2013.01); *H01L 43/10* (2013.01); *H01L 43/14* (2013.01)

(58) Field of Classification Search
    CPC ......... H01L 43/04; H01L 43/06; H01L 43/10; H01L 43/14; H01L 27/222
    (Continued)

(56) References Cited

U.S. PATENT DOCUMENTS 6,174,736 B1   1/2001   Tsukamoto et al.
8,350,347 B2   1/2013   Gaudin et al.
(Continued)

FOREIGN PATENT DOCUMENTS

JP   2005-526351 A   9/2005
JP   5441005 B2      3/2014
(Continued)

OTHER PUBLICATIONS

Bishnoi, Rajendra et al, "Architectural Aspects in Design and Analysis of SOT-based Memories," 2014 19th Asia and South Pacific Design Automation Conference (ASP-DAC), IEEE, Jan. 20, 2014, pp. 700-707, XP032570084, DOI: 10.1109/ASPDAC.2014.6742972.

(Continued)

*Primary Examiner* — Phuc T Dang
(74) *Attorney, Agent, or Firm* — Oliff PLC (57) ABSTRACT

A spin-current magnetization rotational element includes a spin orbit torque wiring extending in a first direction and a first ferromagnetic layer disposed in a second direction intersecting the first direction of the spin orbit torque wiring, the spin orbit torque wiring having a first surface positioned on the side where the first ferromagnetic layer is disposed, and a second surface opposite to the first surface, and the spin orbit torque wiring has a second region on the first surface outside a first region in which the first ferromagnetic layer is disposed, the second region being recessed from the first region to the second surface side.

20 Claims, 8 Drawing Sheets

(51) Int. Cl.
  *H01L 43/06* (2006.01)
  *H01L 43/10* (2006.01)
  *H01L 43/14* (2006.01)
(58) Field of Classification Search
  USPC .......................................................... 257/427
  See application file for complete search history.

(56) References Cited

U.S. PATENT DOCUMENTS

| | | | |
|---|---|---|---|
| 10,910,554 | B2* | 2/2021 | Sasaki ................... H01L 43/04 |
| 2002/0155627 | A1 | 10/2002 | Okazawa et al. |
| 2006/0056223 | A1 | 3/2006 | Ditewig et al. |
| 2011/0129691 | A1 | 6/2011 | Ishiwata et al. |
| 2012/0020152 | A1 | 1/2012 | Gaudin et al. |
| 2013/0026585 | A1 | 1/2013 | Sung et al. |
| 2015/0348606 | A1 | 12/2015 | Buhrman et al. |
| 2016/0020207 | A1 | 1/2016 | Tsuchiya et al. |
| 2017/0076769 | A1 | 3/2017 | Shirotori et al. |
| 2017/0222135 | A1* | 8/2017 | Fukami ................. G11C 11/161 |
| 2017/0249550 | A1* | 8/2017 | Sengupta ............ G06N 3/0635 |
| 2018/0040807 | A1* | 2/2018 | Saito .................... H01L 27/228 |
| 2018/0159026 | A1 | 6/2018 | Shiokawa et al. |
| 2019/0051820 | A1 | 2/2019 | Sugiyama et al. |
| 2019/0189516 | A1 | 6/2019 | Sasaki et al. |

FOREIGN PATENT DOCUMENTS

| | | |
|---|---|---|
| JP | 2016-021530 A | 2/2016 |
| JP | 2017-059594 A | 3/2017 |
| JP | 2017-216286 A | 12/2017 |
| JP | 2019-033166 A | 2/2019 |
| JP | 6620915 B1 | 12/2019 |
| WO | 2016/021468 A1 | 2/2016 |
| WO | 2017/052494 A1 | 3/2017 |
| WO | 2018/189964 A1 | 10/2018 |
| WO | 2019/171715 A1 | 9/2019 |

OTHER PUBLICATIONS

Apr. 22, 2021 Search Report issued in European Patent Application No. 18854094.2.

Miron et al.; Perpendicular switching of a single ferromagnetic layer induced by in-plane current injection; Nature; 2011; pp. 189-194; vol. 476.

Jul. 17, 2020 U.S. Notice of Allowance issued U.S. Appl. No. 16/467,157.

Y.K. Kato, et al, "Observation of the Spin Hall Effect in Semiconductors," Science, vol. 306, pp. 1910-1913, Dec. 10, 2004.

L. Liu, et al, "Spin-Torque Switching with the Giant Spin Hall Effect of Tantalum," Science, vol. 336, Issue 6081, pp. 555-558, May 4, 2012. https://science.sciencemag.org/content/336/6081/555.long Oct. 20, 2020.

L. Liu, et al, "Current-Induced Switching of Perpendicularly Magnetized Magnetic Layers Using Spin Torque from the Spin Hall Effect," Physical Review Letters, 109, pp. 096602-1-096602-5, Aug. 31, 2012.

K.S. Lee, et al, "Threshold Current for Switching of a Perpendicular Magnetic Layer Induced by Spin Hall Effect," Applied Physics Letters, 102, 112410, 18 pgs., Oct. 12, 2012. http://arxiv.org/abs/1210.3442; Jul. 21, 2017.

K. S. Lee, et al, "Thermally Activated Switching of Perpendicular Magnet by Spin-Orbit Torque," Applied Physics Letters, 104, 072413, 6 pgs. Jan. 7, 2014.

S. Fukami, et al, "Magnetization Switching by Spin-Orbit Torque in an Antiferromagnet-Ferromagnet Bilayer System," Nature Materials, vol. 15, 535, 8 pgs., Feb. 15, 2016.

S. Fukami, et al., "A Spin-Orbit Torque Switching Scheme with Collinear Magnetic Easy Axis and Current Configuration," Nature Nanotechnology, 11, 621, 6 pgs., Mar. 21, 2016.

S. Takahashi, et al, "Spin Injection and Detection in Magnetic Nanostructures," Physical Review B 67, pp. 052409-1-052409-4, Nov. 5, 2002.

Yeongkyo Seo, et al, "Area-Efficient SOT-MRAM With a Schottky Diode," IEEE Electron Device Letters, vol. 37, No. 8, p. 982, Aug. 2016.

W. Zhang, et al, "Spin Hall Effects in Metallic Antiferromagnets," Physical Review Letters, PRL 113, pp. 196602-1-196602-6, Nov. 7, 2014.

H. Sato, et al, "Perpendicular-Anisotropy CoFeB—MgO Magnetic Tunnel Junctions with a MgO/CoFeB/Ta/CoFeB/MgO Recording Structure," Applied Physics Letters, 101, 022414-1-4, 5 pgs., May 30, 2012.

L. Liu et al, "Magnetic Oscillations Driven by the Spin Hall Effect in 3-Terminal Magnetic Tunnel Junction Devices," Physical Review Letters, 109, 186602-1-5, 5 pgs., Nov. 2, 2012.

T. Kimura et al, "Electrical Control of the Direction of Spin Accumulation," Physical Review Letters, PRL 99, 166601-1-4, Oct. 19, 2007.

G. Yu, "Switching of Perpendicular Magnetization by Spin-Orbit Torques in the Absence of External Magnetic Fields," Nature Nanotechnology vol. 9, pp. 548-554, May 11, 2014.

* cited by examiner

SPIN-CURRENT MAGNETIZATION ROTATIONAL ELEMENT AND SPIN ORBIT TORQUE TYPE MAGNETORESISTANCE EFFECT ELEMENT

RELATED APPLICATIONS

This is a Divisional Application of U.S. patent application Ser. No. 16/467,157, filed Jun. 6, 2019, which claims the benefit of PCT Application No. PCT/JP2018/029754, filed Aug. 8, 2018, which in turn claims the benefit of Japanese Patent Application No. 2017-172399, filed Sep. 7, 2017. The disclosure of the prior applications is hereby incorporated by reference herein in its entirety.

TECHNICAL FIELD

The present invention relates to a spin-current magnetization rotational element and a spin orbit torque type magnetoresistance effect element.

BACKGROUND ART

A giant magnetoresistance (GMR) element that is configured by a multilayer film including a ferromagnetic layer and a non-magnetic layer and a tunneling magnetoresistance (TMR) element that uses an insulating layer (a tunnel barrier layer, a barrier layer) as a non-magnetic layer is known as a magnetoresistance effect element. In general, the TMR element has a higher element resistance and a larger magnetoresistance (MR) ratio than the GMR element. For that reason, attention is focused on the TMR element as an element for magnetic sensors, high-frequency components, magnetic heads and nonvolatile random-access memories (MRAM).

The MRAM reads and writes data by utilizing the characteristic that the element resistance of the TMR element changes as the direction of magnetization of two ferromagnetic layers sandwiching the insulating layer changes. As a writing method of MRAM, a method in which writing (magnetization rotational) is performed by utilizing a magnetic field created by an electric current and a method in which writing (magnetization rotational) is performed by using a spin-transfer torque (STT) generated by applying an electric current in a laminating direction of a magnetoresistance effect element are known.

Although the magnetization rotational of the TMR element using STT is efficient from the viewpoint of energy efficiency, the rotational current density for the magnetization rotational is high. It is desirable that the rotational current density be low from the viewpoint of long life span of the TMR element. This also applies to the GMR element.

Thus, in recent years, attention has been focused on magnetization rotational utilizing a pure spin-current generated by spin-orbit interaction, which performs magnetization rotational by a mechanism different from STT (for example, Non-Patent Literature 1). Although this mechanism has not been fully clarified yet, it is believed that pure spin-current caused by spin-orbit interaction or a Rashba effect at an interface of dissimilar materials induces spin orbit torque (SOT) and magnetization rotational occurs due to SOT. Pure spin-current is generated by the same number of spin up and spin down electrons flowing in opposite directions, and the flow of electric charge is canceled out. For that reason, electric current flowing through the magnetoresistance effect element is zero, and it is expected that the magnetoresistance effect element has a long life span.

CITATION LIST

Non-Patent Literature

Non-Patent Literature 1

I. M. Miron, K. Garello, G. Gaudin, P.-J. Zermatten, M. V. Costache, S. Auffret, S. Bandiera, B. Rodmacq, A, Schuhl, and P. Gambardella, Nature, 476, 189 (2011)

SUMMARY OF INVENTION

Technical Problem

If impurities having conductivity are adhered to a side wall of the magnetoresistance effect element, magnetic characteristics of a ferromagnetic material constituting the magnetoresistance effect element are deteriorated. In addition, the adhered impurities cause current leakage in the magnetoresistance effect element. These impurities can be removed by applying an ion beam to the side wall of the magnetoresistance effect element. However, in the case of the magnetoresistance effect element using the SOT, a spin orbit torque wiring extends in a direction intersecting a laminating direction of the magnetoresistance effect element. When a part of the ion beam irradiates the spin orbit torque wiring, a part of the spin orbit torque wiring is etched and reattaches to the side wall of the magnetoresistance effect element. The substance constituting the conductive spin orbit torque wiring becomes impurities as a result of reattachment.

The present invention has been made in view of the above circumstances, and it is an object of the present invention to provide a spin-current magnetization rotational element and a spin orbit torque type magnetoresistance effect element capable of efficiently removing impurities adhered to a side wall.

Solution to Problem

The present inventors have found that impurities can be suppressed from reattachment to a side wall by relatively lowering the position of a second region outside a first region in which a ferromagnetic layer is laminated. That is, the present invention provides the following means to solve the above-mentioned problems.

(1) A spin-current magnetization rotational element according to a first aspect of the present invention includes: a spin orbit torque wiring extending in a first direction and a first ferromagnetic layer disposed in a second direction intersecting the first direction of the spin orbit torque wiring, in which the spin orbit torque wiring has a first surface positioned on the side where the first ferromagnetic layer is disposed and a second surface opposite to the first surface, and the spin orbit torque wiring has a second region on the first surface outside a first region in which the first ferromagnetic layer is disposed, the second region being recessed from the first region to the second surface side.

(2) In the spin-current magnetization rotational element according to the above aspect, the second region may be positioned outside in the first direction of the first region.

(3) The spin-current magnetization rotational element according to the above aspect further includes a via wiring extending in a direction intersecting the first direction from the second surface of the surface of the spin orbit torque wiring, in which the second region may overlap the via wiring in plan view from the second direction.

(4) In the spin-current magnetization rotational element according to the above aspect, the depth of the recessed portion of the second region with respect to the first region may be less than or equal to the thickness of the spin orbit torque wiring.

(5) In the spin-current magnetization rotational element according to the above aspect, the recessed portion in the second region may have an inclined surface inclined with respect to the first region on the first surface to be deeper the further away it is from the first region.

(6) In the spin-current magnetization rotational element according to the above mode, when a thickness of the first ferromagnetic layer is h, an inclination angle of the inclined surface is $\varphi$, the shortest distance between the first region and the second region is G, and an incident angle of an ion beam incident on the first ferromagnetic layer with a plane parallel to the first surface in the first region is $\theta$, $G > h/\tan(\theta+2\varphi)$ may be satisfied.

(7) The spin orbit torque type magnetoresistance effect element according to the second aspect includes the spin-current magnetization rotational element according to the above aspects, a non-magnetic layer disposed on a surface opposite to a surface positioned on the side of the spin orbit torque wiring in the surfaces of the first ferromagnetic layer, and a second ferromagnetic layer sandwiching the non-magnetic layer between the first ferromagnetic layer and the second ferromagnetic layer.

(8) In the spin orbit torque type magnetoresistance effect element according to the above aspect, when a height of a laminate including the first ferromagnetic layer, the non-magnetic layer, and the second ferromagnetic layer is H, an inclination angle of an inclined surface inclined with respect to the first surface to be deeper the further away it is from the first region in the second region is $\varphi$, a shortest distance between the first region and the second region is G, and an incident angle of an ion beam incident on the first ferromagnetic layer with a plane parallel to the first surface in the first region is $\theta$, $G > H/\tan(\theta+2\varphi)$ may be satisfied.

(9) A method for manufacturing a spin-current magnetization rotational element according to a third aspect, which is the method for manufacturing a spin-current magnetization rotational element according to the first aspect, includes processes of preparing a substrate having a plurality of recessed portions arranged in one direction on one main surface and forming a layer configured by a member for a spin orbit torque wiring on one main surface of the substrate, processing the layer of the member for the spin orbit torque wiring to extend along the one direction while covering the plurality of recessed portions to form a spin orbit torque wiring, forming a layer configured by a member for a first ferromagnetic layer on the spin orbit torque wiring, and forming a first ferromagnetic layer by processing the layer of the member for the first ferromagnetic layer so that a portion overlapping the recessed portions is removed in plan view seen from a laminating direction.

Advantageous Effects of Invention

It is possible to provide a spin-current magnetization rotational element and a spin orbit torque type magnetoresistance effect element capable of efficiently removing impurities adhering to side walls.

DESCRIPTION OF EMBODIMENTS

Hereinafter, the present embodiment will be described in detail with reference to the drawings as appropriate. In the drawings used in the following description, in order to make features easy to understand, characteristic portions may be illustrated in an enlarged manner for the sake of convenience, and dimensional ratios of respective components may be different from actual ones. Materials, dimensions, and the like exemplified in the following description are merely examples, and the present invention is not limited thereto and can be carried out to be appropriately modified within a range that provides the effects of the present invention.

Spin-Current Magnetization Rotational Element

First Embodiment

Figure 1:
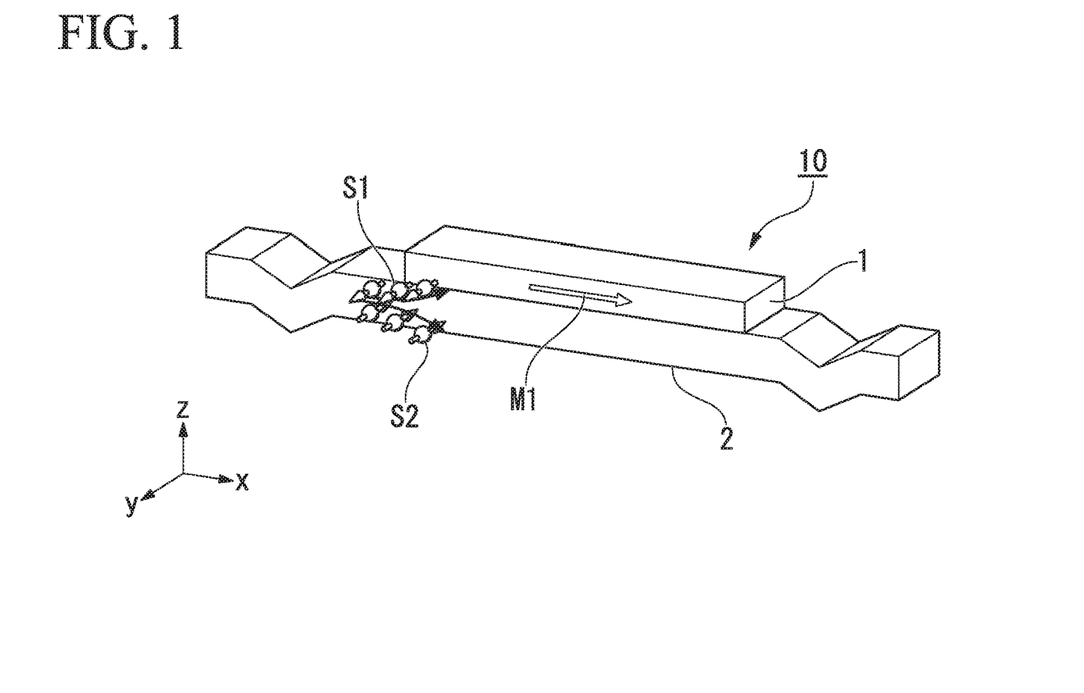
FIG. 1 is a perspective view schematically showing a spin-current magnetization rotational element according to a first embodiment.
Figure 2:
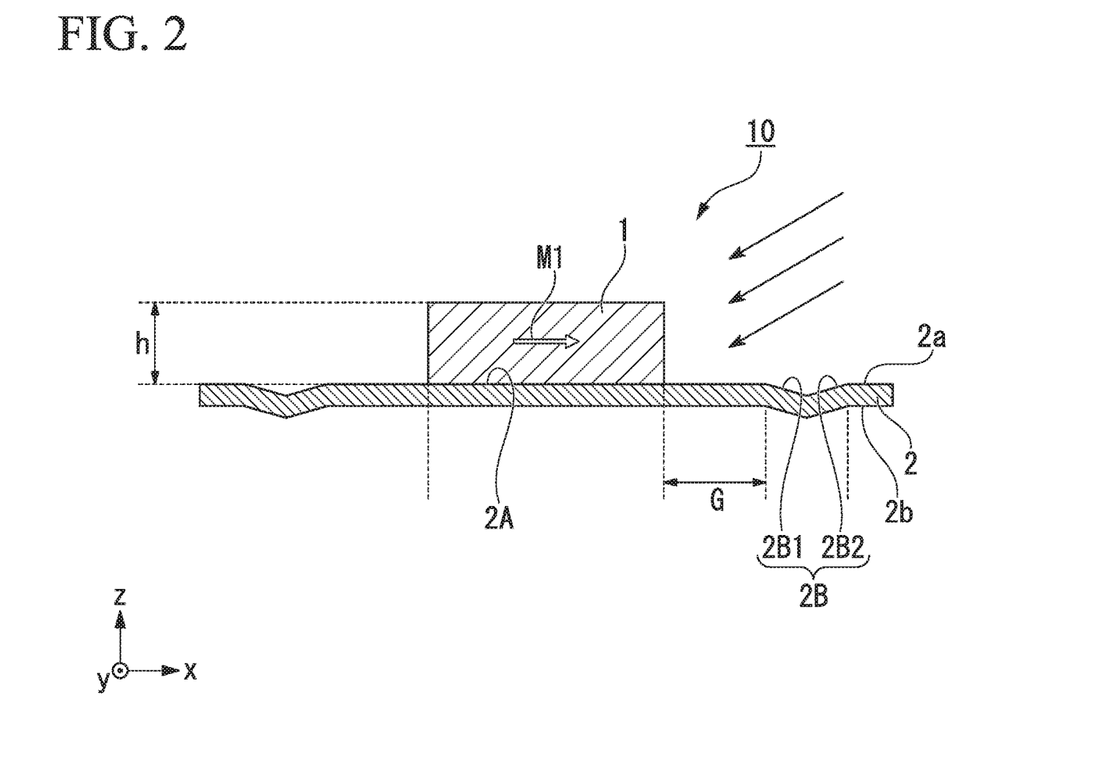
FIG. 2 is a cross-sectional view schematically showing the spin-current magnetization rotational element according to the first embodiment.

FIG. 1 is a perspective view schematically showing a spin-current magnetization rotational element according to a first embodiment. Also, FIG. 2 is a cross-sectional view schematically showing the spin-current magnetization rotational element according to the first embodiment. The spin-current magnetization rotational element 10 according to the first embodiment includes a first ferromagnetic layer 1 and a spin orbit torque wiring 2. Hereinafter, a first direction in which the spin orbit torque wiring 2 extends is defined as an x direction, a laminating direction (a second direction) of the first ferromagnetic layer 1 is defined as a z direction, and a direction orthogonal to both of the x direction and the z direction is defined as a y direction.

First Ferromagnetic Layer

The first ferromagnetic layer 1 is disposed (placed) to stand upright in the second direction (the z direction) intersecting the first direction (the x direction) of the spin orbit torque wiring 2. A thickness direction of the first ferromagnetic layer 1 may be substantially parallel to the z direction. The first ferromagnetic layer 1 functions by changing the direction of its magnetization M1. Although the first ferromagnetic layer 1 is an in-plane magnetized film in which the magnetization M1 is oriented in the x direction in FIG. 1, it may be an in-plane magnetized film oriented in a different direction in the xy plane and may be a perpendicular magnetized film oriented in the z direction.

For the first ferromagnetic layer 1, a ferromagnetic material, particularly, a soft magnetic material, can be employed. For example, metals selected from the group consisting of Cr, Mn, Co, Fe and Ni, alloys containing at least one of the above metals, and alloys containing the above metals and at least one element of B, C, and N, or the like can be used. Specifically, Co—Fe, Co—Fe—B, and Ni—Fe can be exemplified.

Further, in order to obtain higher output, a Heusler alloy such as $Co_2FeSi$ may be used as the first ferromagnetic layer 1. The Heusler alloy contains an intermetallic compound having a chemical composition of $X_2YZ$, in which X is a transition metal element of Co, Fe, Ni, or Cu group or a noble metal element on the periodic table, Y is a transition metal of Mn, V, Cr or Ti group or an element of X, and Z is a typical element of group III to group V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like can be exemplified.

Spin Orbit Torque Wiring

The spin orbit torque wiring 2 extends in the x direction. The spin orbit torque wiring 2 is connected to one surface of the first ferromagnetic layer 1 in the z direction. The spin orbit torque wiring 2 may be directly connected to the first ferromagnetic layer 1 or may be connected via another layer.

The spin orbit torque wiring 2 is made of a material in which a pure spin-current is generated due to the Spin Hall effect when a current flows. As such a material, any material may be used as long as a pure spin-current is generated in the spin orbit torque wiring 2. Therefore, the spin orbit torque wiring 2 may not be necessarily made of a single element and may be made of a plurality of materials, for example, such as a material which easily generates a pure spin-current and a material which hardly generates a pure spin-current.

The Spin Hall effect is a phenomenon in which, when an electric current flows in a material, a pure spin-current is induced in a direction orthogonal to the direction of current due to the interaction (the spin-orbit interaction) acting between the orbital angular momentum and the spin angular momentum of electrons responsible for the current. The mechanism by which a pure spin-current is induced by the Spin Hall effect will be described.

As shown in FIG. 1, when a potential difference is applied to both ends of the spin orbit torque wiring 2 in the x direction, electric current flows in the x direction. When the electric current flows, a first spin S1 oriented in the y direction and a second spin S2 oriented in the −y direction are respectively bent in directions orthogonal to the electric current. The normal Hall effect and the Spin Hall effect are the same in that a moving (flowing) direction of moving (flowing) electric charge (electrons) can be bent. On the other hand, they are greatly different in that, in the normal Hall effect, charged particles moving in a magnetic field undergo Lorentz force so that their moving direction can be bent, whereas, in the Spin Hall effect, a moving direction of a spin can be bent only by the movement of electrons (flowing of electric current) even if there is no magnetic field.

Since the number of electrons of the first spin S1 is equal to the number of electrons of the second spin S2 in a non-magnetic material (a material that is not a ferromagnetic material), the number of electrons of the first spin S1 oriented upward is equal to the number of electrons of the second spin S2 oriented downward in the drawings. For that reason, the electric current as a net flow of charge is zero. This spin-current which is not accompanied by the electric current is particularly called pure spin-current.

When an electric current flows through a ferromagnetic material, the phenomenon in which the first spin S1 and the second spin S2 are bent in opposite directions is the same as the non-magnetic material. However, in the ferromagnetic material, either one of the first spin S1 and the second spin S2 is large, and as a result, a net flow of charge occurs (voltage is generated). Therefore, as a material of the spin orbit torque wiring 2, a material only consisting of a ferromagnetic material is not included.

Here, when the flow of electrons in the first spin S1 is defined as J↑, the flow of electrons in the second spin S2 as J↓, and the spin-current as JS, JS is defined by $JS = J\uparrow - J\downarrow$. The pure spin-current JS flows in the z direction in the drawings. Here, JS is a flow of electrons with a polarizability of 100%. In FIG. 1, when a ferromagnetic material is brought into contact with an upper surface of the spin orbit torque wiring 2, the pure spin-current diffuses and flows into the ferromagnetic material. That is, spin is injected into the first ferromagnetic layer 1.

The spin orbit torque wiring 2 is configured by any one of a metal, an alloy, an intermetallic compound, a metal boride, a metal carbide, a metal silicide, and a metal phosphide which has a function of generating a pure spin-current by a Spin Hall effect when an electric current flows.

The main constituent material of the spin orbit torque wiring 2 may be a non-magnetic heavy metal. Here, the heavy metal means a metal having a specific gravity equal to or higher than yttrium. The non-magnetic heavy metal may be a non-magnetic metal having a large atomic number, that is, a non-magnetic metal having an atomic number of 39 or more and having d electrons or f electrons in the outermost shell. In such a non-magnetic metal, the spin-orbit interaction causing the Spin Hall effect is large.

When an electric current flows through a metal having a small atomic number, all the electrons move in a direction opposite to the electric current regardless of the direction of spin. In contrary to this, when an electric current flows through a non-magnetic metal having a large atomic number which has d electrons or f electrons in the outermost shell, the spin-orbit interaction becomes larger and the Spin Hall effect strongly acts on electrons, and accordingly, the moving direction of electrons depends on the direction of spin of electrons. As a result, the pure spin-current JS is easily generated in the non-magnetic metal.

In addition, the spin orbit torque wiring 2 may contain a magnetic metal. The magnetic metal means a ferromagnetic metal or an antiferromagnetic metal. If a small amount of magnetic metal is contained in the non-magnetic metal, it becomes a scattering factor of spin. If the spin is scattered, the spin-orbit interaction is enhanced and the spin-current generation efficiency with respect to the current is increased. The main configuration of the spin orbit torque wiring 2 may be made of only an antiferromagnetic metal.

However, if the addition amount of the magnetic metal is excessively increased, the generated pure spin-current is scattered by the added magnetic metal and, as a result, the action of decreasing the spin-current becomes strong in some cases. Therefore, the molar ratio of the added magnetic metal may be sufficiently smaller than the total molar ratio of the elements constituting the spin orbit torque wiring. As a guide, the molar ratio of the added magnetic metal may be 3% or less.

In addition, the spin orbit torque wiring 2 may include a topological insulator. The main configuration of the spin orbit torque wiring 2 may be a topological insulator. Although the topological insulator is a material in which the inside of the substance is an insulator or a high resistance body, a spin-polarized metallic state is generated on the surface. An internal magnetic field is generated in this material by the spin-orbit interaction. As a result, even if there is no external magnetic field, a new topological phase develops due to the effect of the spin-orbit interaction. This is a topological insulator, and, due to strong spin orbital interaction and breaking of inversion symmetry at the edge, pure spin-current can be generated with high efficiency.

As the material of the topological insulator, for example, $SnTe$, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$ and the like may be used. These topological insulators are capable of generating spin-current with high efficiency.

The spin orbit torque wiring 2 has a first surface 2a positioned on the side where the first ferromagnetic layer 1 is arranged (laminated) and a second surface 2b on the side opposite to the first surface 2a. The first surface 2a has a first region 2A, in which the first ferromagnetic layer 1 is disposed, and a second region 2B positioned outside the first region 2A and recessed in the −z direction (second surface 2b side) from the first region 2A. In FIG. 1, the second region 2B is positioned on an outer region in the +x direction and on an outer region in the −x direction when viewed from the first region 2A. That is, the first region 2A is sandwiched by a plurality of second regions 2B in the x direction.

When the second region 2B is formed in the spin orbit torque wiring 2, impurities adhering to the first ferromagnetic layer 1 can be efficiently removed in a manufacturing process of the spin-current magnetization rotational element 10, and the magnetic characteristics of the first ferromagnetic layer 1 can be enhanced.

FIGS. 3A to 3D are schematic diagrams explaining an example of a method for manufacturing the spin-current magnetization rotational element 10.

Figure 3A:
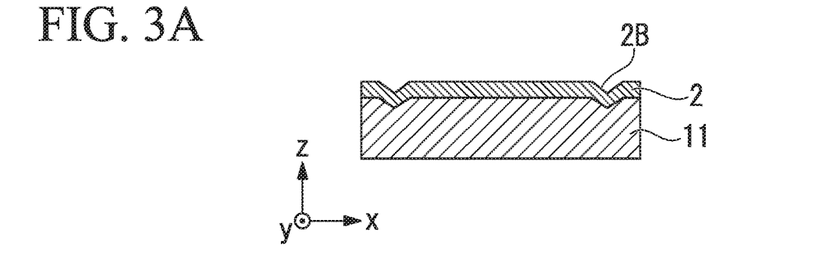
FIG. 3A is a cross-sectional view of a workpiece in a manufacturing process of the spin-current magnetization rotational element according to the first embodiment.

First, a substrate 11 having a plurality (two in this case) of recessed portions 2B aligned in one direction (x direction) on one main surface is prepared, and a layer (layer made of a member for spin orbit torque wiring) serving as a base of the spin orbit torque wiring is formed (laminated) on one main surface of the substrate 11. As a lamination method, known methods such as a sputtering method and a chemical vapor deposition (CVD) method can be used. Next, the layer serving as the base of the spin orbit torque wiring is processed to extend along the x direction while covering the plurality of recessed portions 2B by using a technique such as photolithography to form the spin orbit torque wiring 2. Since the spin orbit torque wiring 2 is formed to follow the shape of the surface of the substrate 11, the second region 2B can be produced by providing corresponding recessed portions in the substrate 11 (FIG. 3A).

Then, an insulating layer is coated to surround a periphery of the spin orbit torque wiring. As the insulating layer, an oxide film, a nitride film, or the like can be used.

Figure 3B:
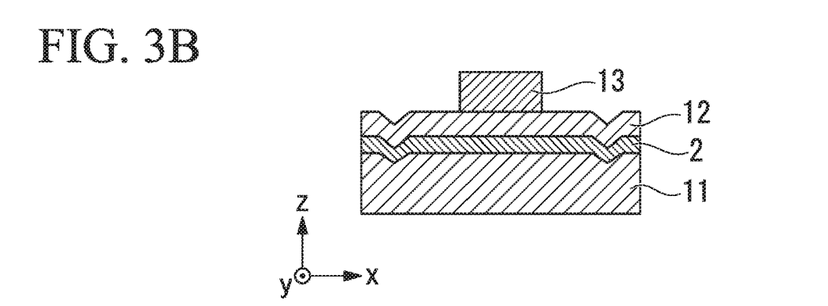
FIG. 3B is a cross-sectional view of the workpiece in the manufacturing process of the spin-current magnetization rotational element according to the first embodiment.

Next, the surface of the insulating layer and the spin orbit torque wiring 2 is planarized by chemical mechanical polishing (CMP). On the planarized surface, a layer (layer made of a material for the first ferromagnetic layer) 12 serving as the base of the first ferromagnetic layer is formed, and a protective layer 13 made of a resist or the like is formed on the layer 12 serving as the base of the first ferromagnetic layer (FIG. 3B).

Figure 3C:
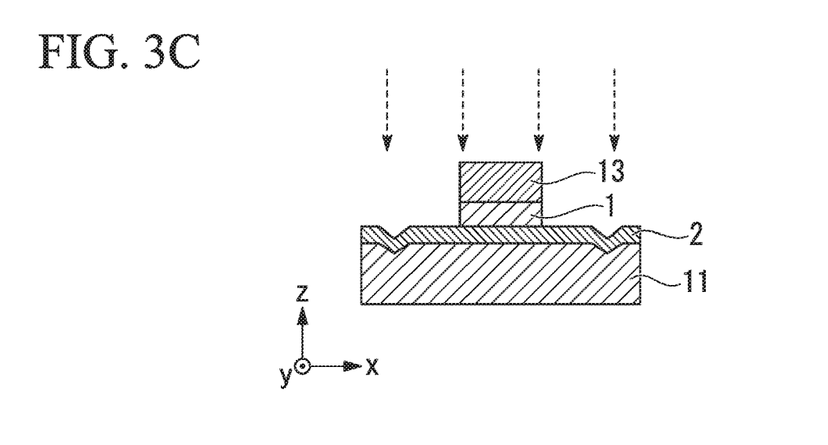
FIG. 3C is a cross-sectional view of the workpiece in the manufacturing process of the spin-current magnetization rotational element according to the first embodiment.

Subsequently, a portion of the layer 12 serving as the base of the first ferromagnetic layer, which overlaps the recessed portions, is removed through the protective layer 13 in plan view from the laminating direction (z direction), thereby forming the first ferromagnetic layer 1. For processing, methods such as reactive ion etching (RIE) and ion beam etching (IBE) can be used (FIG. 3C).

Figure 3D:
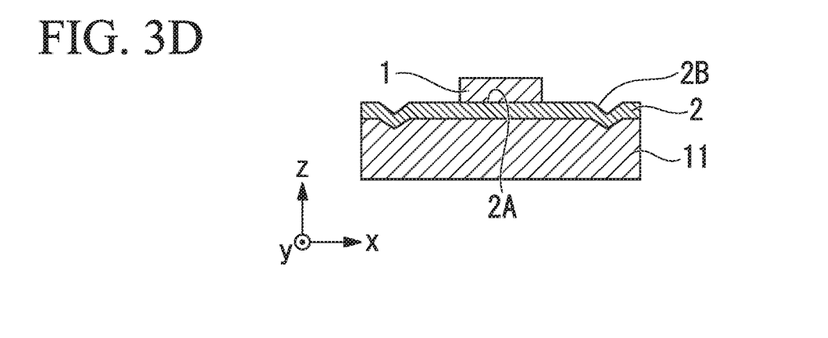
FIG. 3D is a cross-sectional view of the workpiece in the manufacturing process of the spin-current magnetization rotational element according to the first embodiment.

Impurities may attach to the side wall of the first ferromagnetic layer 1 during processing. These impurities deteriorate magnetic properties of the first ferromagnetic layer 1. Attached impurities can be removed by irradiating the ion beam from the side wall (FIG. 3D). An incident angle of the ion beam (the angle formed by the traveling direction of the ion beam and the xy plane) may be close to parallel to the xy plane. The angle formed by the traveling direction of the incident beam and the xy plane can be tilted to about 10°.

When the position in the z direction of the second region 2B positioned on the side of the first region 2A is higher than the first region 2A, the side wall of the first ferromagnetic layer 1 becomes a shadow of the second region 2B and the ion beam cannot be efficiently irradiated to the side wall of the first ferromagnetic layer 1. On the other hand, if the second region 2B is recessed from the first region 2A on the first surface 2a, the second region 2B does not inhibit the ion beam incident on the first ferromagnetic layer 1. That is, it is possible to irradiate the side wall of the first ferromagnetic layer 1 directly with the ion beam so that impurities can be removed efficiently.

Also, the recessed portion of the second region 2B shown in FIG. 2 is configured by a first inclined surface 2B1 and a second inclined surface 2B2. The first inclined surface 2B1 is an inclined surface inclined with respect to the first region 2A of the first surface 2a to be deeper the further away it is from the first region 2A. The second inclined surface 2B2 is an inclined surface inclined with respect to the first region 2A of the first surface 2a to be deeper the closer it is to the first region 2A. As shown in FIG. 2, by providing the first inclined surface 2B1 in the second region 2B, reattachment of the impurities from the spin orbit torque wiring 2 can be suppressed. For the sake of processing convenience, a case in which a protruding portion following the shape of the recessed portion is formed on the side opposite to the first surface 2a is shown, but this protruding portion is not essential.

As described above, the ion beam is incident at an angle with respect to the xy plane. Therefore, a part of the ion beam is incident on the spin orbit torque wiring 2. When the ion beam is irradiated, a part of the spin orbit torque wiring 2 is scattered. The scattered matter reattaches to the side wall of the first ferromagnetic layer 1. Since the spin orbit torque wiring 2 has conductivity, the scattered matter which has scattered and reattached becomes an impurity which deteriorates the magnetic characteristics of the first ferromagnetic layer 1.

Figure 4A:
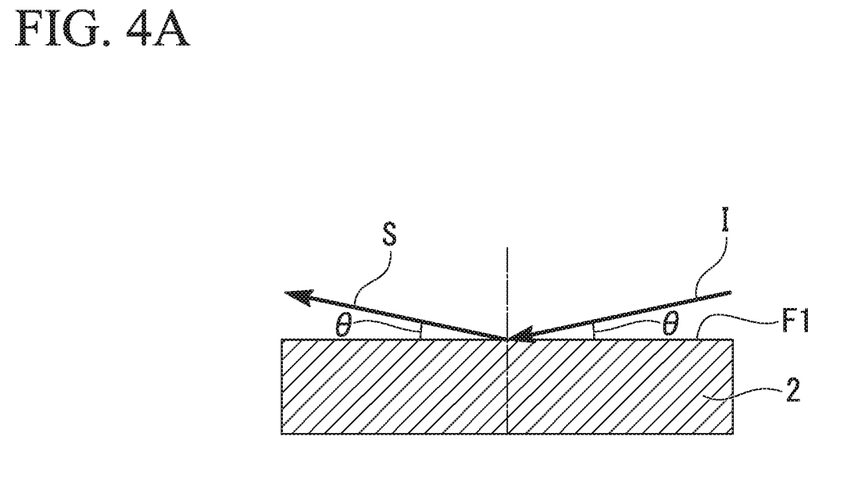
FIG. 4A is a diagram schematically showing a scattering direction of impurities scattered by an ion beam incident on a flat surface.
Figure 4B:
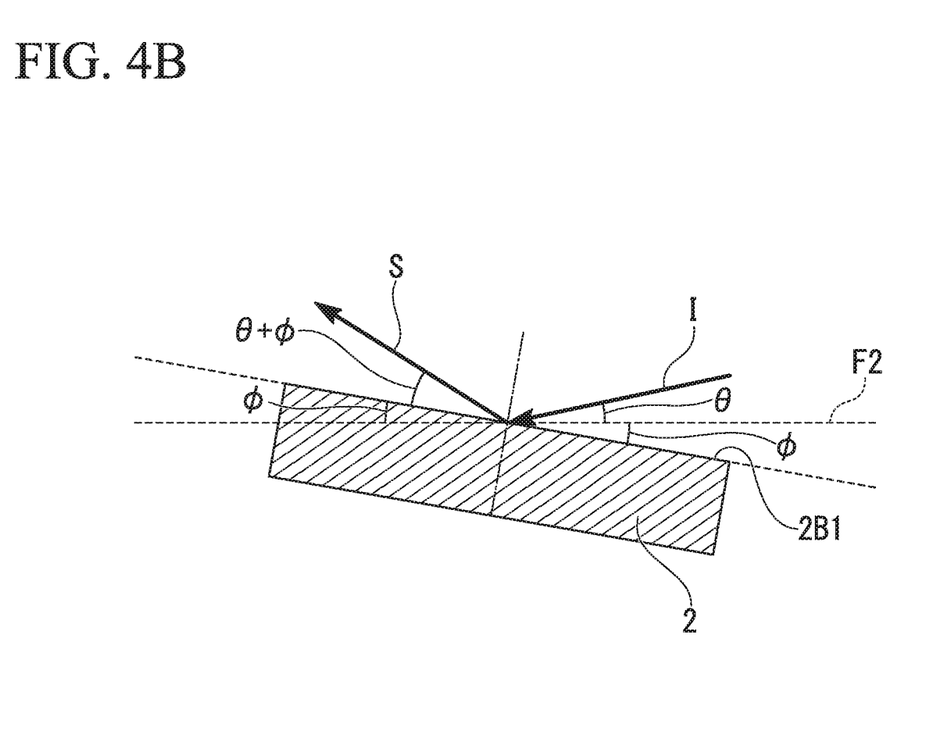
FIG. 4B is a diagram schematically showing a scattering direction of scattered impurities by an ion beam incident on a first inclined plane.

FIGS. 4A and 4B are diagrams schematically showing the scattering direction of impurities generated by the ion beam incident on the flat surface and the scattering direction of the impurity generated by the ion beam incident on the first inclined surface. As shown in FIG. 4A, when the ion beam I is incident on the flat surface F1 of the spin orbit torque wiring 2 at an incident angle θ, the scattered direction of the scattered matter S is at an angle θ with respect to the flat surface F1. On the other hand, when the ion beam I is incident on the first inclined surface 2B1 of the spin orbit torque wiring 2 as shown in FIG. 4B, the scattering direction of the scattering matter S is an angle θ+2φ with respect to the surface F2. Here, φ is the inclination angle of the first inclined surface 2B1, and the plane F2 is a plane parallel to the horizontal plane extending from the end on the second region 2B side of the first region 2A and also parallel to the flat face F1.

That is, the first inclined surface 2B1 can tilt the scattering direction of the scattering object S in the +z direction (upward). As shown in FIG. 2, the height (thickness) h of the first ferromagnetic layer 1 is finite. Therefore, the scattering direction of the scattering object S is tilted in the +z direction (upward) so that the amount of the scattering matter S adhering to the first ferromagnetic layer 1 can be reduced.

In order to suppress the amount of the scattering matter S adhering to the first ferromagnetic layer 1 as much as possible, the relational equation of $G>h/\tan(\theta+2\varphi)$ may be satisfied. Here, G corresponds to the shortest distance between the first region 2A and the second region 2B. When this relationship is satisfied, the scattering material S splashed on the first inclined surface 2B1 passes over the end (top) in the +z direction (upward) of the first ferromagnetic layer 1 so that the amount of impurities reattached to the first ferromagnetic layer 1 can be reduced.

From the viewpoint of reducing the adhesion amount of the scattered matter S, the inclination angle φ of the first inclined surface 2B1 may be large. However, if the inclination angle φ is too large, the positional relationship between the first region 2A and the second region 2B in the z direction greatly fluctuates, which makes it difficult to uniformly manufacture the spin orbit torque wiring 2. For example, the thickness of the spin orbit torque wiring 2 formed in the second region 2B becomes thinner and the spin orbit torque wiring 2 may break. Therefore, the depth of the recessed portion of the second region 2B with respect to the first region 2A may be less than or equal to the thickness of the spin orbit torque wiring 2.

As described above, according to the spin-current magnetization rotational element 10 of the present embodiment, it is possible to efficiently remove impurities adhering to the side wall of the first ferromagnetic layer 1. By removing impurities, the magnetic characteristics of the first ferromagnetic layer 1 are stabilized. Further, by providing the first inclined surface 2B1 in the second region 2B, reattachment of impurities from the spin orbit torque wiring 2 can be suppressed.

Figure 5A:
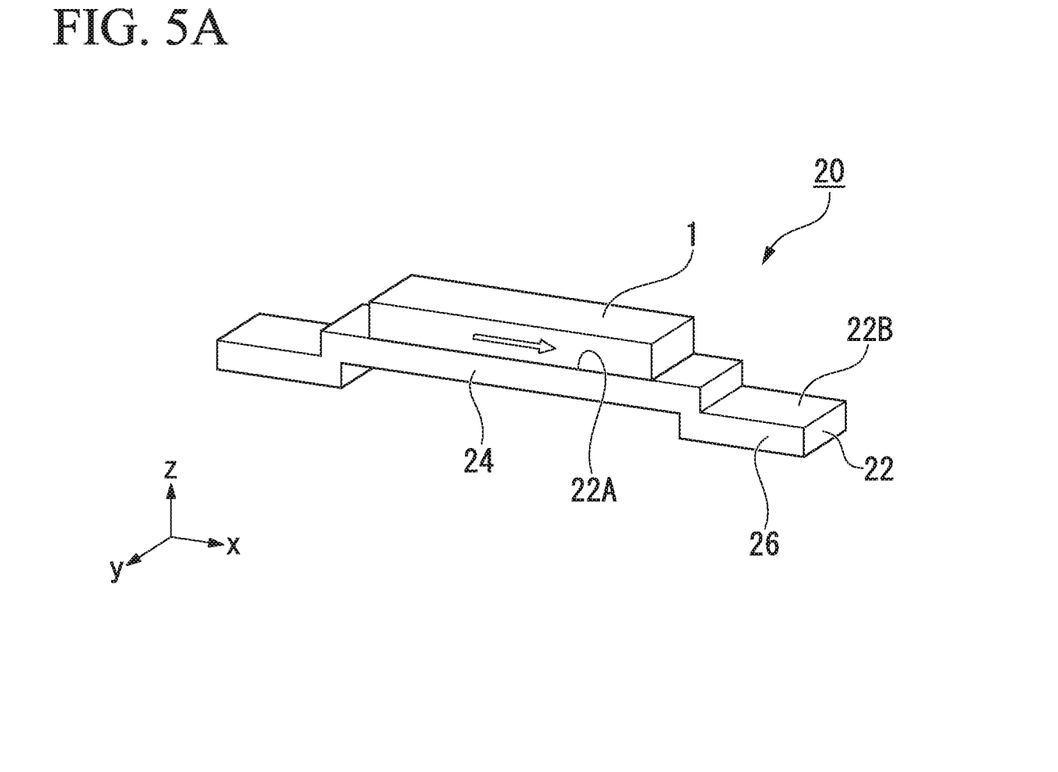
FIG. 5A is a perspective view schematically showing another example of the spin-current magnetization rotational element according to the first embodiment.
Figure 5B:
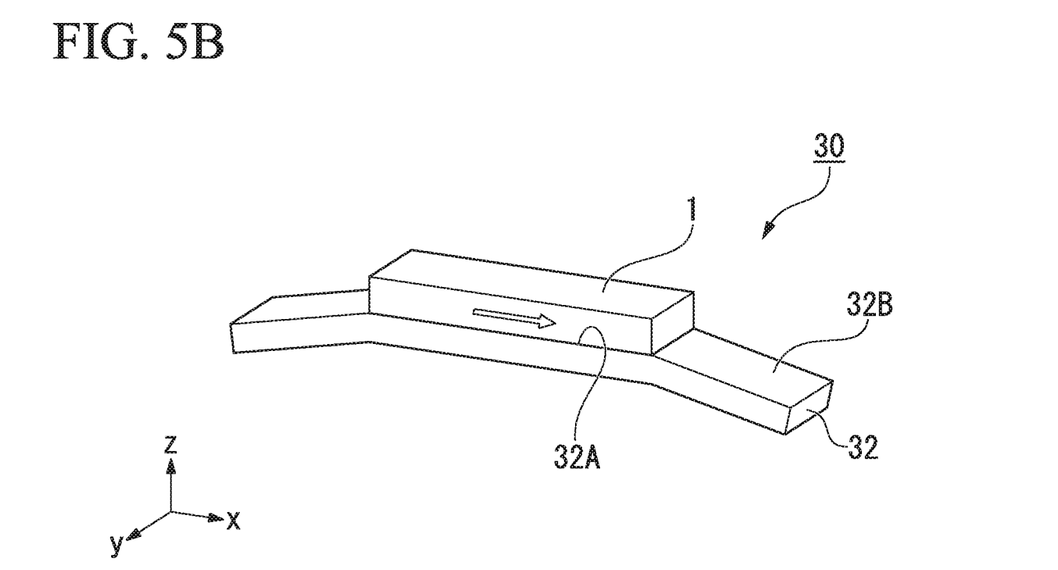
FIG. 5B is a perspective view schematically showing another example of the spin-current magnetization rotational element according to the first embodiment.

The spin-current magnetization rotational element 10 is not limited to the example shown in FIG. 1. FIGS. 5A and 5B are perspective views schematically showing another example of the spin-current magnetization rotational element according to the first embodiment.

In the spin-current magnetization rotational element 20 shown in FIG. 5A, the shape of the spin orbit torque wiring 22 is different from that of the spin orbit torque wiring 2 applied to the spin-current magnetization rotational element 10 according to the first embodiment. The spin orbit torque wiring 22 shown in FIG. 5A includes a first portion 24 including a first region 22A and a second portion 26 including a second region 22B. Since the second portion 26 is positioned in the −z direction (downward) with respect to the first portion 24, the second region 22B is recessed in the −z direction with respect to the first region 22A.

In the spin-current magnetization rotational element 30 shown in FIG. 5B, the shape of the spin orbit torque wiring 32 is different from that of the spin orbit torque wiring 2 applied to the spin-current magnetization rotational element 10 according to the first embodiment. The spin orbit torque wiring 32 shown in FIG. 5B consists only of the inclined surface, which is inclined so that the second region 32B is deeper in the −z direction the further away the second region 32B is from the first region 32A. The second region 32B is recessed in the z direction with respect to the first region 32A.

Also, the second regions 2B, 22B, and 32B presented above are all positioned in the x direction with respect to the first regions 2A, 22A, and 32A. The second region is not limited to the position in the x direction with respect to the first region but may be the position in the y direction. However, the spin orbit torque wiring 2 extends in the x direction. That is, the insulating layer expands to the side of the y direction of the first ferromagnetic layer 1. When the scattered matter generated by the ion beam is an insulator, the scattered matter has little influence on the magnetic characteristics of the first ferromagnetic layer 1. Therefore, from the viewpoint of suppressing the influence of impurities on the magnetic characteristics of the first ferromagnetic layer 1, the second region may be positioned on the side in the x direction of the first region. In addition, the first ferromagnetic layer 1 and the spin orbit torque wiring 2 may have the same width in the y direction. When a part of the spin orbit torque wiring 2 is exposed in the y direction, there arises a problem in that the metal is scattered by the ion beam from the y direction. However, the occurrence of this problem can be suppressed by aligning the widths of the first ferromagnetic layer 1 and the spin orbit torque wiring 2.

Second Embodiment

Figure 6:
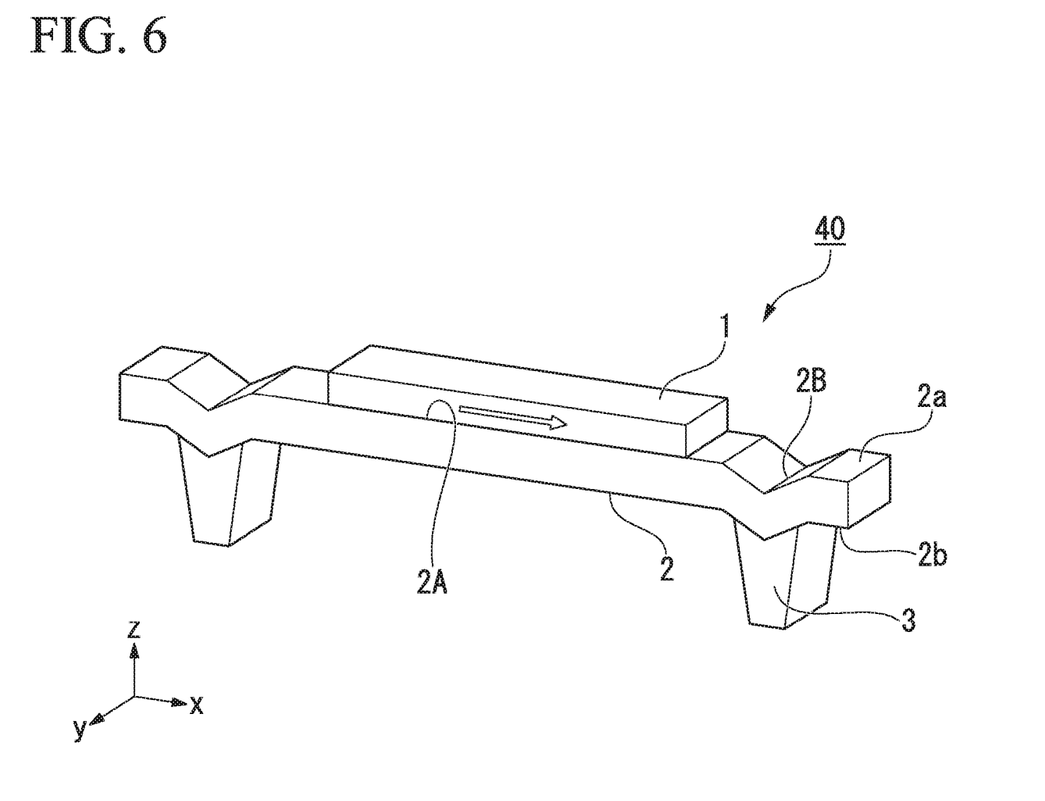
FIG. 6 is a schematic perspective view of a spin-current magnetization rotational element according to a second embodiment.

FIG. 6 is a schematic perspective view of a spin-current magnetization rotational element 40 according to a second embodiment. The spin-current magnetization rotational element 40 is different from the spin-current magnetization rotational element 10 according to the first embodiment in that the spin-current magnetization rotational element 40 has a via wiring 3. The other configurations are the same as those of the spin-current magnetization rotational element 10 according to the first embodiment, and the corresponding components are denoted by the same reference numerals.

In FIG. 6, the via wiring 3 extends along the second direction (z direction) intersecting the first direction (x direction) from the second surface 2b on the opposite side to the first surface 2a in the surface of the spin orbit torque wiring 2. The via wiring 3 is a connection wiring for allowing a current to flow in the x direction in which the spin orbit torque wiring 2 extends. By extending the via wirings 3 in the z direction and providing wirings using the three-dimensional space, it is possible to reduce the element area required for one spin-current magnetization rotational element 40, and the integration of the spin-current magnetization rotational element 40 can be enhanced.

In the spin-current magnetization rotational element 40 shown in FIG. 6, the second region 2B is positioned at a position overlapping the via wiring 3 when viewed from the z direction (in plan view from the second direction). When the second region 2B is provided at a position where the via wiring 3 is connected, the second region 2B of the first surface 2a can be easily recessed with respect to the first region 2A.

Figure 7A:
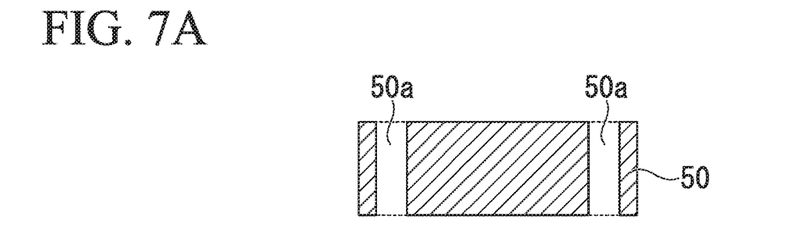
FIG. 7A is a cross-sectional view of a workpiece in a manufacturing process of a spin-current magnetization rotational element having a via wiring.
Figure 7B:
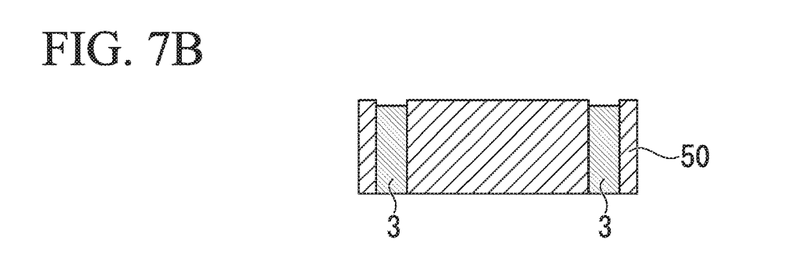
FIG. 7B is a cross-sectional view of the workpiece in the manufacturing process of the spin-current magnetization rotational element having the via wiring.

FIGS. 7A to 7D are diagrams schematically showing an example of a method of manufacturing the spin-current magnetization rotational element 40 having the via wiring 3. First, an opening 50a extending in the z direction is provided in the interlayer insulating film 50 formed on the second surface 2b of the spin orbit torque wiring 2 (FIG. 7A). Next, a metal is laminated (buried) in the opening 50a, and a via wiring 3 is formed (FIG. 7B). At this time, the length of the via wiring 3 is adjusted to be shorter than the thickness of the interlayer insulating film 50.

Figure 7C:
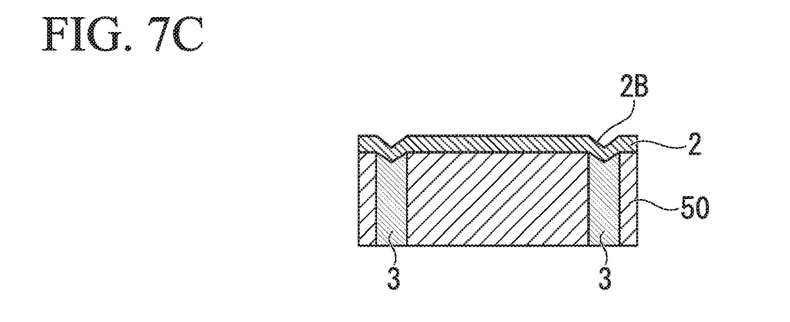
FIG. 7C is a cross-sectional view of the workpiece in the manufacturing process of the spin-current magnetization rotational element having the via wiring.
Figure 7D:
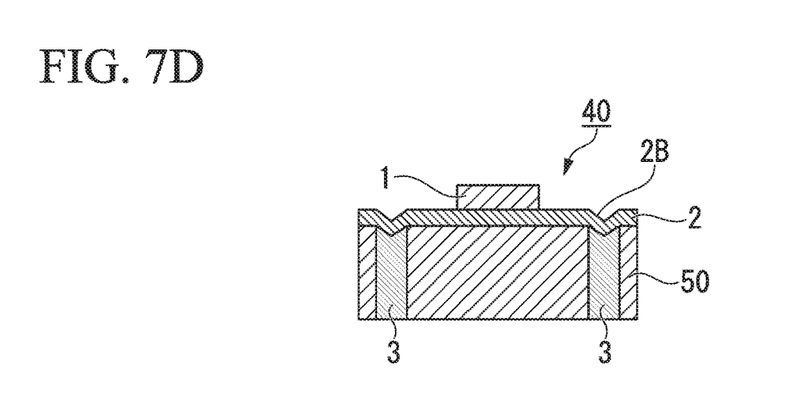
FIG. 7D is a cross-sectional view of the workpiece in the manufacturing process of the spin-current magnetization rotational element having the via wiring.

Then, a layer (a member for spin orbit torque wiring) serving as the base of the spin orbit torque wiring is laminated (disposed) on an interlayer insulating film 50 and the via wiring 3, and the layer is processed into the spin orbit torque wiring 2 (FIG. 7C). Since the via wiring 3 is recessed in the thickness direction of the interlayer insulating film 50, the spin orbit torque wiring 2 also follows its shape. As a result, the position in the xy plane of the second region 2B of the spin orbit torque wiring 2 coincides with the position in the xy plane of the via wiring 3, and the second region 2B and the via wiring 3 overlap when viewed from the z direction. After the second region 2B recessed from the first region 2A is formed on the first surface 2a, the spin-current magnetization rotational element 40 can be manufactured by the same procedure as in FIG. 3 (FIG. 7D).

As described above, according to the spin-current magnetization rotational element 40 of the present embodiment, it is possible to easily recess the second region 2B with respect to the first region 2A in the process of manufacturing the via wiring 3. Further, impurities adhering to the side walls of the first ferromagnetic layer 1 can be efficiently removed by depressing the second region 2B with respect to the first region 2A.

Spin Orbital Torque Type Magnetoresistance Effect Element

Third Embodiment

Figure 8:
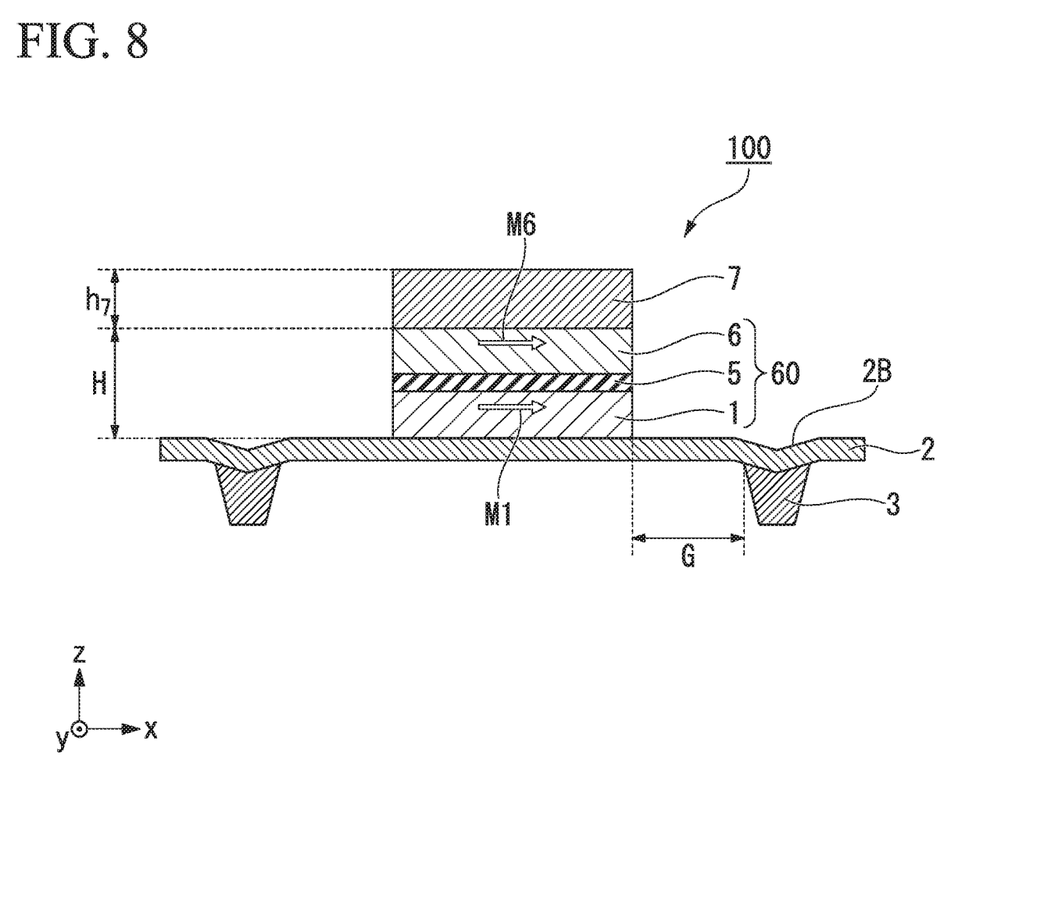
FIG. 8 is a schematic cross-sectional view of a spin orbit torque type magnetoresistance effect element 100 according to a third embodiment.

FIG. 8 is a schematic sectional view of a spin orbit torque type magnetoresistance effect element 100 according to a third embodiment. The spin orbit torque type magnetoresistance effect element 100 shown in FIG. 8 includes a first ferromagnetic layer 1, a spin orbit torque wiring 2, a via wiring 3, a non-magnetic layer 5, a second ferromagnetic layer 6, and a mask layer 7. The laminate configured by the first ferromagnetic layer 1, the spin orbit torque wiring 2 and the via wiring 3 corresponds to the spin-current magnetization rotational element 40 according to the second embodiment shown in FIG. 6. The non-magnetic layer 5 is disposed on the side of the surface of the first ferromagnetic layer 1 opposite to the surface positioned on the side of the spin orbit torque wiring 2. The second ferromagnetic layer 6 is disposed on the non-magnetic layer 5 to sandwich the non-magnetic layer 5 between the second ferromagnetic layer 6 and the first ferromagnetic layer 1. Instead of the spin-current magnetization rotational element 40 according to the second embodiment, the spin-current magnetization rotational elements 10, 20, and 30 according to the first embodiment may be used. A description of the same configuration as that of the spin-current magnetization rotational element 40 of the second embodiment will be omitted.

The laminated body (a functional section 60), in which the first ferromagnetic layer 1, the non-magnetic layer 5, and the second ferromagnetic layer 6 are laminated, functions in the same manner as an ordinary magnetoresistance effect element. The functional section 60 functions due to the magnetization M6 of the second ferromagnetic layer 6 being fixed in one direction (z direction) and the direction of the magnetization M1 of the first ferromagnetic layer 1 being relatively changed. When this functional section 60 is applied to a coercive force difference type (pseudo spin valve type) magnetoresistive random-access memory (MRAM), the coercive force of the second ferromagnetic layer 6 is made to be larger than the coercive force of the first ferromagnetic layer 1. When the functional section 60 is applied to an exchange bias type (spin valve type) MRAM, the magnetization M6 of the second ferromagnetic layer 6 is fixed by exchange coupling with the antiferromagnetic layer.

Also, when the non-magnetic layer 5 is made of an insulator, the functional section 60 has the same structure as a tunneling magnetoresistance (TMR) element, and when the functional section 60 is made of a metal, it has the same configuration as the giant magnetoresistance (GMR) device.

As a laminated structure of the functional section 60, a known laminated structure of magnetoresistance effect elements can be adopted. For example, each layer may be configured by a plurality of layers or may be provided with another layer such as an antiferromagnetic layer for fixing the magnetization direction of the second ferromagnetic layer 6. The second ferromagnetic layer 6 is called a fixed layer or a reference layer, and the first ferromagnetic layer 1 is called a free layer, a memory layer, or the like.

For the material of the second ferromagnetic layer 6, a known material can be used. For example, a metal selected from the group consisting of Cr, Mn, Co, Fe and Ni, and an alloy exhibiting ferromagnetism containing at least one of these metals can be used. An alloy containing these metals and at least one element of B, C, and N can be used. Particularly, Co—Fe and Co—Fe—B can be exemplified.

In addition, in order to obtain a higher output, a Heusler alloy such as $Co_2FeSi$ may be used as the material of the second ferromagnetic layer 6. The Heusler alloy contains an intermetallic compound having a chemical composition of $X_2YZ$, in which X is a transition metal element of Co, Fe, Ni, or Cu group or a noble metal element in the periodic table, Y is a transition metal of Mn, V, Cr or Ti group or an elemental species of X, and Z is a typical element of group III to group V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like can be exemplified.

In order to make the coercive force of the second ferromagnetic layer 6 larger than the coercive force of the first ferromagnetic layer 1, an antiferromagnetic material such as IrMn, PtMn or the like may be used as a material in contact with the second ferromagnetic layer 6. Also, in order to prevent the leakage magnetic field of the second ferromagnetic layer 6 from affecting the first ferromagnetic layer 1, a synthetic ferromagnetic coupling structure may be adopted.

As the non-magnetic layer 5, a known material can be used. For example, when the non-magnetic layer 5 is made of an insulator (in the case of a tunnel barrier layer), $Al_2O_3$, $SiO_2$, MgO, $MgAl_2O_4$, or the like can be used as a material thereof. In addition to these materials, a material in which an Al, Si, or Mg part is substituted with Zn, Be, or the like can also be used. Among them, since MgO and $MgAl_2O_4$ are materials that can realize coherent tunneling, spin can be efficiently injected. When the non-magnetic layer 5 is made of a metal, Cu, Au, Ag, or the like can be used as the material thereof. Further, when the non-magnetic layer 5 is made of a semiconductor, Si, Ge, $CuInSe_2$, $CuGaSe_2$, $Cu(In, Ga)Se_2$, or the like can be used as a material thereof.

The functional section 60 may have other layers. An underlayer may be provided on the surface of the first ferromagnetic layer 1 on the side opposite to the non-magnetic layer 5. The layer disposed between the spin orbit torque wiring 2 and the first ferromagnetic layer 1 may not dissipate the spin propagating from the spin orbit torque wiring 2. For example, it is known that silver, copper, magnesium, aluminum, etc. have a long spin diffusion length of 100 nm or more, and spin hardly dissipates. Further, the thickness of this layer may be not more than the spin diffusion length of the material constituting the layer. If the thickness of the layer is less than or equal to the spin diffusion length, the spin propagating from the spin orbit torque wiring 2 can be sufficiently transmitted to the first ferromagnetic layer 1.

Also, a mask layer 7 is laminated in the functional section 60 shown in FIG. 8. The mask layer 7 corresponds to the protective layer 13 shown in FIG. 3A. The mask layer 7 is used for processing the shape of the functional section 60. The mask layer 7 also functions as a cap layer. The cap layer adjusts the crystallinity of the functional section 60 and strongly aligns the magnetization M6 of the second ferromagnetic layer 6 in a predetermined direction.

Further, as shown in FIG. 4, in order to suppress reattachment of scattering matter, the relational equation of $G>H/\tan(\theta+2\varphi)$ may be satisfied, and the relational equation of $G>(H+h_7)/\tan(\theta+2\varphi)$ may be further satisfied. Here, G is the shortest distance between the first region 2A and the second region 2B, H is the height (thickness) of the functional section 60, and $h_7$ is the height (thickness) of the mask layer 7. Further, $\theta$ is the incident angle of the ion beam with respect to the xy plane, and $\varphi$ is the inclination angle of the inclined plane.

If the relational equation of $G>H/\tan(\theta+2\varphi)$ is satisfied, it is possible to suppress the reattachment of scattered matter to the functional section 60, and if the relational equation of $G>(H+h_7)/\tan(\theta+2\varphi)$ is satisfied, it is possible to suppress the reattachment of the scattered matter to the laminated structure including the mask layer 7. When scattered matter having conductivity adheres to the functional section 60, it causes current leakage and the MR ratio decreases.

The spin orbit torque type magnetoresistance effect element according to the third embodiment can suppress the scattering matter from adhering to the functional section 60. For that reason, the MR ratio of the functional section 60 can be increased. Also, it is possible to record and read data using the change in the resistance value of the functional section 60 caused by the difference in the relative angle between the magnetization M1 of the first ferromagnetic layer 1 and the magnetization M6 of the second ferromagnetic layer 6.

Fourth Embodiment

Magnetic Memory

Figure 9:
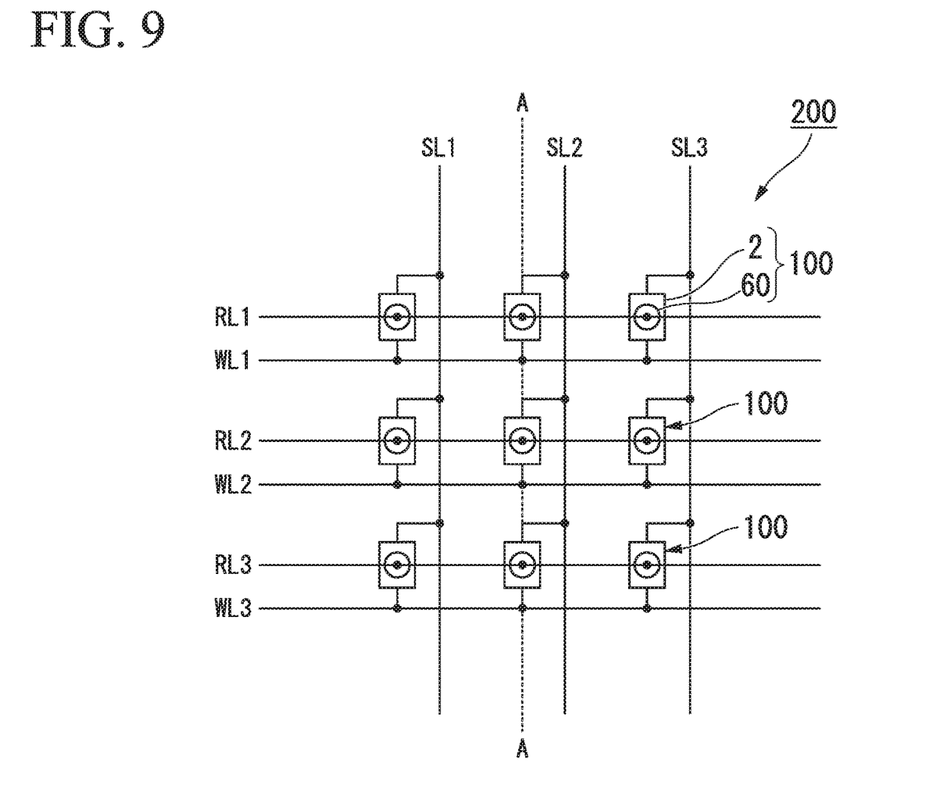
FIG. 9 is a plan view of a magnetic memory including a plurality of the spin orbit torque type magnetoresistance effect elements.

FIG. 9 is a plan view of a magnetic memory 200 including a plurality of spin orbit torque type magnetoresistance effect elements 100 (see FIG. 8). FIG. 8 corresponds to a cross-sectional view of the spin orbit torque type magnetoresistance effect element 100 cut along the A-A plane in FIG. 9. In the magnetic memory 200 shown in FIG. 9, the spin orbit torque type magnetoresistance effect element 100 is arranged in a 3×3 matrix. FIG. 9 is an example of a magnetic memory, and the number and arrangement of the spin orbit torque type magnetoresistance effect elements 100 are arbitrary.

One word line WL1 to WL3, one source line SL1 to SL3, and one read line RL1 to RL3 are each connected to the spin orbit torque type magnetoresistance effect element 100.

By selecting the word lines WL1 to WL3 to which current is applied and the source lines SL1 to SL3, a current is supplied to the spin orbit torque wiring 2 of an arbitrary spin orbit torque type magnetoresistance effect element 100 to perform a writing operation. Further, by selecting the read lines RL1 to RL3 and the source lines SL1 to SL3 to which current is applied, a current is caused to flow in the laminating direction of the functional section 60 of an arbitrary spin orbit torque type magnetoresistance effect element 100 to perform a reading operation. The word lines WL1 to WL3, the source lines SL1 to SL3, and the read lines RL1 to RL3 to which current is applied can be selected by transistors or the like. That is, since data of an arbitrary element can be read out from the plurality of spin orbit torque type magnetoresistance effect elements 100, the magnetic memory 200 can be utilized as a magnetic memory.

Fifth Embodiment

High-Frequency Magnetic Element

Figure 10:
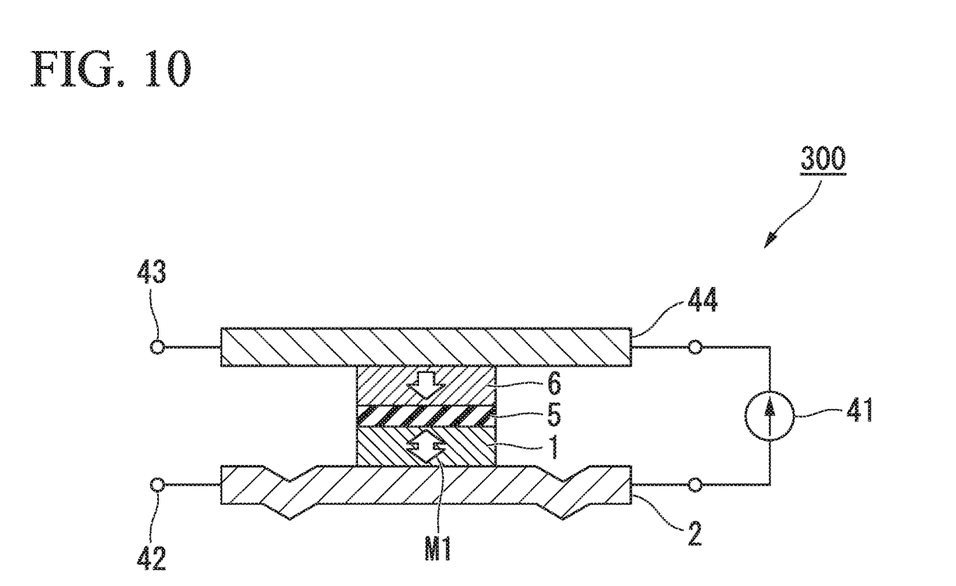
FIG. 10 is a schematic cross-sectional view of a high-frequency magnetic element according to a fifth embodiment.

FIG. 10 is a schematic cross-sectional view of a high-frequency magnetic element according to a fifth embodiment. The high-frequency magnetic element 300 shown in FIG. 6 includes a spin orbit torque type magnetoresistance effect element 100 shown in FIG. 8 and a DC power supply 41 connected to the spin orbit torque type magnetoresistance effect element 100.

A high-frequency current is input from the input terminal 42 of the high-frequency magnetic element 300. The high-frequency current generates a high-frequency magnetic field. In addition, when a high-frequency current flows through the spin orbit torque wiring 2, a pure spin-current is induced and spin is injected into the first ferromagnetic layer 1. The magnetization M1 of the first ferromagnetic layer 1 vibrates due to the high-frequency magnetic field and the injected spin.

The magnetization M1 of the first ferromagnetic layer 1 undergoes ferromagnetic resonance when the frequency of the high-frequency current input from the input terminal 42 is the ferromagnetic resonance frequency. When the magnetization M1 of the first ferromagnetic layer 1 undergoes ferromagnetic resonance, the resistance value change of the functional section of the magnetoresistance effect becomes large. This change in resistance value is read out from the output terminal 43 by applying a direct current or a direct current voltage via the electrode 44 by the direct current power supply 41.

That is, when the frequency of the signal input from the input terminal 42 becomes the ferromagnetic resonance frequency of the magnetization M1 of the first ferromagnetic layer 1, the change in the resistance value output from the output terminal 43 becomes large, and when it comes to other frequencies, the change in the resistance value output from the output terminal 43 becomes smaller. Utilizing the magnitude of this change in the resistance value, the high-frequency magnetic element functions as a high-frequency filter.

Although preferred embodiments of the present invention have been described in detail, the present invention is not limited to specific embodiments, and various modifications and changes are possible within the scope of the gist of the present invention described in the claims.

Reference Signs List

1 First ferromagnetic layer
2, 22, 32 Spin orbit torque wiring
2A, 22A, 32A First region
2B, 22B, 32B Second region
2B1 First inclined surface
2B2 Second inclined surface
2a First surface
2b Second surface
3 Via wiring
5 Non-magnetic layer
6 Second ferromagnetic layer
7 Mask layer
10, 20, 30, 40 Spin-current magnetization rotational element
11 Substrate
12 Layer serving as the base of the first ferromagnetic layer
13 Protective layer
24 Part 1
26 Part 2
41 DC power supply
42 Input terminal
43 Output terminal
44 Electrode
50 Interlayer insulating film
50a Opening
60 Function section
100 Spin orbit torque type magnetoresistance effect element
200 Magnetic memory
300 High-frequency magnetic element
M1, M6 Magnetization
I Ion beam
S Scattered matter

The invention claimed is:

1. A spin-current magnetization rotational element, comprising:
a spin orbit torque wiring extending in a first direction; and
a first ferromagnetic layer disposed in a second direction intersecting the first direction of the spin orbit torque wiring,
wherein:
the spin orbit torque wiring includes a first surface positioned on the side where the first ferromagnetic layer is disposed and a second surface opposite to the first surface;
the spin orbit torque wiring has a first region protruding on the first surface; and
the first ferromagnetic layer is disposed on the first region.

2. The spin-current magnetization rotational element according to claim 1,
wherein a second region is positioned outside in the first direction of the first region.

3. The spin-current magnetization rotational element according to claim 1, further comprising:
a via wiring extending in a direction intersecting the first direction from the second surface of the surface of the spin orbit torque wiring,
wherein the second region overlaps the via wiring in plan view from the second direction.

4. The spin-current magnetization rotational element according to claim 1,
wherein the depth of the recessed portion of the second region with respect to the first region is less than or equal to the thickness of the spin orbit torque wiring.

5. The spin-current magnetization rotational element according to claim 1,
wherein the recessed portion in the second region has an inclined surface inclined with respect to the first region on the first surface to be deeper the further away it is from the first region.

6. The spin-current magnetization rotational element according to claim 5,
wherein, when the thickness of the first ferromagnetic layer is h, the inclination angle of the inclined surface is $\varphi$, the shortest distance between the first region and the second region is G, and an incident angle of the ion beam incident on the first ferromagnetic layer with a plane parallel to the first surface in the first region is $\theta$, $G>h/\tan(\theta+2\varphi)$ is satisfied.

7. A spin orbit torque type magnetoresistance effect element, comprising:
the spin-current magnetization rotational element according to claim 1;
a non-magnetic layer disposed on a surface of the surface of the first ferromagnetic layer opposite to a surface positioned on the side of the spin orbit torque wiring; and a second ferromagnetic layer sandwiching the non-magnetic layer between the first ferromagnetic layer and the second ferromagnetic layer.

8. The spin orbit torque type magnetoresistance effect element according to claim 7,
wherein, when the height of the laminate including the first ferromagnetic layer, the non-magnetic layer, and the second ferromagnetic layer is H, an inclination angle of an inclined surface inclined with respect to the first surface to be deeper the further away it is from the first region in the second region is $\varphi$, a shortest distance between the first region and the second region is G, and an incident angle of the ion beam incident on the first ferromagnetic layer with a plane parallel to the first surface in the first region is $\theta$, $G>H/\tan(\theta+2\varphi)$ is satisfied.

9. A method for manufacturing the spin-current magnetization rotational element according to claim 1, comprising the processes of:
preparing a substrate having a plurality of recessed portions arranged in one direction on one main surface and forming a layer configured by a member for a spin orbit torque wiring on one main surface of the substrate;
processing the layer of the member for the spin orbit torque wiring to extend along the one direction while covering the plurality of recessed portions to form a spin orbit torque wiring; forming a layer configured by a member for a first ferromagnetic layer on the spin orbit torque wiring; and forming a first ferromagnetic layer by processing the layer of the member for the first ferromagnetic layer so that a portion overlapping the recessed portion is removed in plan view from the laminating direction.

10. The spin-current magnetization rotational element according to claim 2, further comprising:
a via wiring extending in a direction intersecting the first direction from the second surface of the surface of the spin orbit torque wiring,
wherein the second region overlaps the via wiring in plan view from the second direction.

11. The spin-current magnetization rotational element according to claim 2,
wherein the depth of the recessed portion of the second region with respect to the first region is less than or equal to the thickness of the spin orbit torque wiring.

12. The spin-current magnetization rotational element according to claim 3,
wherein the depth of the recessed portion of the second region with respect to the first region is less than or equal to the thickness of the spin orbit torque wiring.

13. The spin-current magnetization rotational element according to claim 2,
wherein the recessed portion in the second region has an inclined surface inclined with respect to the first region on the first surface to be deeper the further away it is from the first region.

14. The spin-current magnetization rotational element according to claim 3,
wherein the recessed portion in the second region has an inclined surface inclined with respect to the first region on the first surface to be deeper the further away it is from the first region.

15. The spin-current magnetization rotational element according to claim 4, wherein the recessed portion in the second region has an inclined surface inclined with respect to the first region on the first surface to be deeper the further away it is from the first region.

16. A spin orbit torque type magnetoresistance effect element, comprising:
the spin-current magnetization rotational element according to claim 2;
a non-magnetic layer disposed on a surface of the surface of the first ferromagnetic layer opposite to a surface positioned on the side of the spin orbit torque wiring; and
a second ferromagnetic layer sandwiching the non-magnetic layer between the first ferromagnetic layer and the second ferromagnetic layer.

17. A spin orbit torque type magnetoresistance effect element, comprising:
the spin-current magnetization rotational element according to claim 3;
a non-magnetic layer disposed on a surface of the surface of the first ferromagnetic layer opposite to a surface positioned on the side of the spin orbit torque wiring; and
a second ferromagnetic layer sandwiching the non-magnetic layer between the first ferromagnetic layer and the second ferromagnetic layer.

18. A spin orbit torque type magnetoresistance effect element, comprising:
the spin-current magnetization rotational element according to claim 4;
a non-magnetic layer disposed on a surface of the surface of the first ferromagnetic layer opposite to a surface positioned on the side of the spin orbit torque wiring; and
a second ferromagnetic layer sandwiching the non-magnetic layer between the first ferromagnetic layer and the second ferromagnetic layer.

19. A spin orbit torque type magnetoresistance effect element, comprising:
the spin-current magnetization rotational element according to claim 5;
a non-magnetic layer disposed on a surface of the surface of the first ferromagnetic layer opposite to a surface positioned on the side of the spin orbit torque wiring; and
a second ferromagnetic layer sandwiching the non-magnetic layer between the first ferromagnetic layer and the second ferromagnetic layer.

20. A spin orbit torque type magnetoresistance effect element, comprising:
the spin-current magnetization rotational element according to claim 6;
a non-magnetic layer disposed on a surface of the surface of the first ferromagnetic layer opposite to a surface positioned on the side of the spin orbit torque wiring; and
a second ferromagnetic layer sandwiching the non-magnetic layer between the first ferromagnetic layer and the second ferromagnetic layer.

* * * * *